United States Patent [19]
Taki

[11] Patent Number: 5,461,345
[45] Date of Patent: Oct. 24, 1995

[54] FREQUENCY SYNCHRONOUS CIRCUIT FOR REDUCING TRANSITION PERIOD FROM POWER ON STATE TO STABLE STATE

[75] Inventor: Yoshitaka Taki, Kawasaki, Japan

[73] Assignee: Fujitsu Limited, Kanagawa, Japan

[21] Appl. No.: 187,699

[22] Filed: Jan. 27, 1994

[30] Foreign Application Priority Data

Sep. 20, 1993 [JP] Japan .................................. 5-233766

[51] Int. Cl.$^6$ ...................................................... H03L 7/00
[52] U.S. Cl. ............................ 331/1 A; 331/14; 331/25; 375/354; 375/355; 375/356; 327/141; 327/155; 327/160; 327/162
[58] Field of Search ...................... 375/108, 111, 375/119, 118, 120, 354, 355, 356, 362, 371, 373, 376; 331/25, 1 A, 14, 17, 1 R; 327/99, 107, 155, 156, 160, 162, 141; 455/260

[56] References Cited

U.S. PATENT DOCUMENTS

| | | | |
|---|---|---|---|
| 3,676,793 | 7/1972 | Brown | 331/14 X |
| 3,893,040 | 7/1975 | Harp | 331/1 A |
| 4,716,575 | 12/1987 | Douros et al. | 375/3 |

Primary Examiner—Robert J. Pascal
Assistant Examiner—Arnold Kinkead

[57] ABSTRACT

A frequency synchronous circuit has a first selection unit, a first counter unit, a second counter unit, a storage/average unit, and a comparison unit. The first selection unit is used to select one sampling signal from a first sampling signal having a first sampling time and a second sampling signal having a second sampling time shorter than the first sampling time. The first counter unit is used to count a reference signal supplied from outside the frequency synchronous circuit during the sampling time of the selected one sampling signal, and the second counter unit is used to count a synchronous clock signal to be output from the frequency synchronous circuit during the sampling time of the selected one sampling signal. The storage/average unit, which is operatively connected to the first counter unit, is used to store and average an output signal of the first counter unit. The comparison unit, which is connected to the storage/ average unit and the second counter unit, is used to compare an output signal from the storage/average unit with an output signal from the second counter unit, and the frequency synchronous circuit outputs the synchronous clock signal whose frequency is synchronized in accordance with an output signal of the comparison unit. Therefore, a transition period determined from a power ON state to a stable state can be reduced, and further, an original clock signal can be obtained and output by removing any noise components from a clock signal.

10 Claims, 7 Drawing Sheets

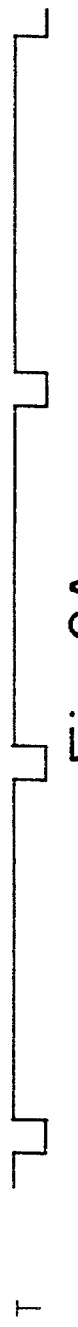
Fig.3A  T
Fig.3B  Ta
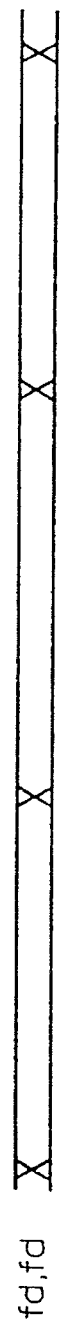
Fig.3C  fd,f'd
Fig.3D  Tb  b
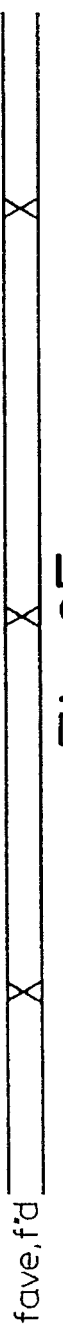
Fig.3E  fave,f'd
Fig.3F  Tc

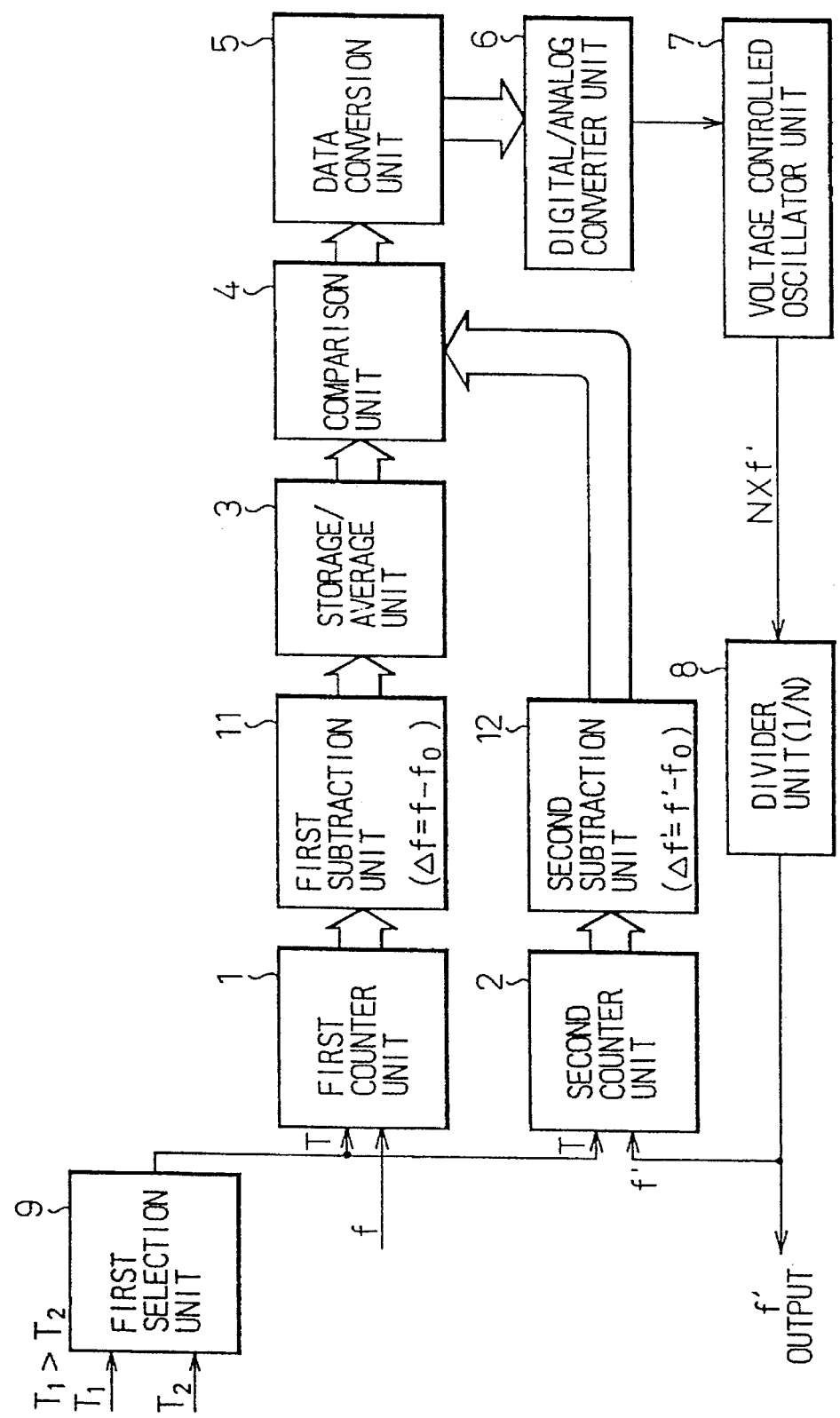

5,461,345

FREQUENCY SYNCHRONOUS CIRCUIT FOR REDUCING TRANSITION PERIOD FROM POWER ON STATE TO STABLE STATE

BACKGROUND OF THE INVENTION

1. Field of the Invention

The present invention relates to a frequency synchronous circuit, and more particularly, to a frequency synchronous circuit used for a digital synchronous network in a communication system.

2. Description of the Related Art

Recently, in accordance with the requirements for realizing a digital synchronous network in a communication system such SONET (Synchronous Optical Network) or SDH (Synchronous Digital Hierarchy), a very stable clock signal (reference signal) must be transmitted. Therefore, it is required to provide a frequency synchronous circuit which can pick up and output an original clock signal by removing noise (noise components) caused in a transmission line by various factors.

Conventionally, in a prior art frequency synchronous circuit, a very stable PLL (Phase Locked Loop) circuit having a VCXO (Voltage-Controlled Crystal (X-tal) Oscillator) is used. However, in this prior art frequency synchronous circuit, the PLL operation may fluctuate in accordance with various factors, for example, jitter and wander (which is jitter with a frequency of less than 10 Hz), especially the wander.

Therefore, in the prior art frequency synchronous circuit (PLL circuit), the cut-off frequency of the PLL circuit is reduced in order to decrease the influences of jitter and wander. However, for example, when the cut-off frequency of the frequency synchronous circuit is reduced, the pull-in range becomes narrow, and further, the capacitor elements required for a circuit (lag filter or lag/lead filter) having a low cut-off frequency must be large.

Further, when the cut-off frequency of the frequency synchronous circuit is reduced, the responsiveness of the frequency synchronous circuit is reduced. Namely, in the above frequency synchronous circuit, when the frequency synchronous circuit is switched ON (power ON state), a transition period determined from the power ON state to a stable state becomes long. Therefore, in the frequency synchronous circuit having a low cut-off frequency, which can sufficiently decrease the influences of the wander, when the frequency synchronous circuit is switched ON, a considerable time must pass before the circuit can stably operate the digital synchronous network. Further, in the above prior art frequency synchronous circuit, an unusual clock signal may be output until sufficient data is stored into a memory unit (storage/memory unit) of the frequency synchronous circuit.

SUMMARY OF THE INVENTION

An object of the present invention is to provide a frequency synchronous circuit able to pick up and output an original clock signal by removing noise from a clock signal, and to decrease the transition period from a power ON state to a stable state.

According to the present invention, there is provided a frequency synchronous circuit comprising a first selection unit for selecting one sampling signal between a first sampling signal having a first sampling time and a second sampling signal having a second sampling time shorter than the first sampling time; a first counter unit, connected to the first selection unit, for counting a reference signal supplied from outside the frequency synchronous circuit during the sampling time of the selected sampling signal; a second counter unit, connected to the first selection unit, for counting a synchronous clock signal to be output from the frequency synchronous circuit during the sampling time of the selected sampling signal; a storage/average unit, connected to the first counter unit, for storing and averaging an output signal of the first counter unit; and a comparison unit, connected to the storage/average unit and the second counter unit, for comparing an output signal of the storage/average unit with an output signal of the second counter unit, wherein the frequency synchronous circuit outputs the synchronous clock signal whose frequency is synchronized in accordance with an output signal of the comparison unit.

The first selection unit may select the second sampling signal at the time of turning ON power to the frequency synchronous circuit, and the first selection unit may select the first sampling signal during a stable state of the frequency synchronous circuit. The storage/average unit may include initial data, and when power to the frequency synchronous circuit is turned ON, the synchronous clock signal may be determined in accordance with the initial data of the storage/average unit.

The frequency synchronous circuit may further comprise a second selection unit, connected to the first counter unit, the storage/average unit and the comparison unit, for selecting one output signal between the first counter unit and the storage/average unit. The second selection unit may select the output signal of the first counter unit at the time of turning ON power to the frequency synchronous circuit, and the second selection unit may select the output signal of the storage/average unit during a stable state of the frequency synchronous circuit.

The output signal of the first counter unit may be determined in accordance with the frequency of the reference signal, and the output signal of the second counter unit may be determined in accordance with the frequency of the synchronous clock signal. The frequency synchronous circuit may further comprise a data conversion unit, connected to the comparison unit, for converting the output signal of the comparison unit to digital data indicating a voltage level corresponding to the output signal of the comparison unit; a digital/analog converter unit, connected to the data conversion unit, for converting the digital data output from the data conversion unit into an analog voltage; a voltage controlled oscillator unit, connected to the digital/analog converter unit, for generating a signal having a frequency corresponding to the analog voltage output from the D/A converter unit; and a divider unit, connected to the voltage controlled oscillator unit and the second counter unit, for dividing the output signal of the voltage controlled oscillator unit and for outputting the synchronous clock signal.

The frequency synchronous circuit may further comprise a first subtraction unit, connected to the first counter unit and the storage/average unit, for subtracting a specific value from the output signal of the first counter unit and for supplying the subtracted result to the storage/average unit; and a second subtraction unit, connected to the second counter unit and the storage/average unit, for subtracting the specific value from the output signal of the second counter unit and for supplying the subtracted result to the comparison unit. The specific value may be determined to be a center frequency of the reference signal. The frequency synchronous circuit may be applied to a path protection switch ring system of a synchronous optical network or a synchronous digital hierarchy.

BRIEF DESCRIPTION OF THE DRAWINGS

The present invention will be more clearly understood from the description of the preferred embodiments as set forth below with reference to the accompanying drawings, wherein:

FIG. 3 is a timing chart for explaining the operation of the frequency synchronous circuit shown in FIG. 2;

FIG. 7 is a block diagram showing a third embodiment of a frequency synchronous circuit of the present invention.

DESCRIPTION OF THE PREFERRED EMBODIMENTS

Below, preferred embodiments of a frequency synchronous circuit according to the present invention will be explained with reference to the drawings.

Figure 1:
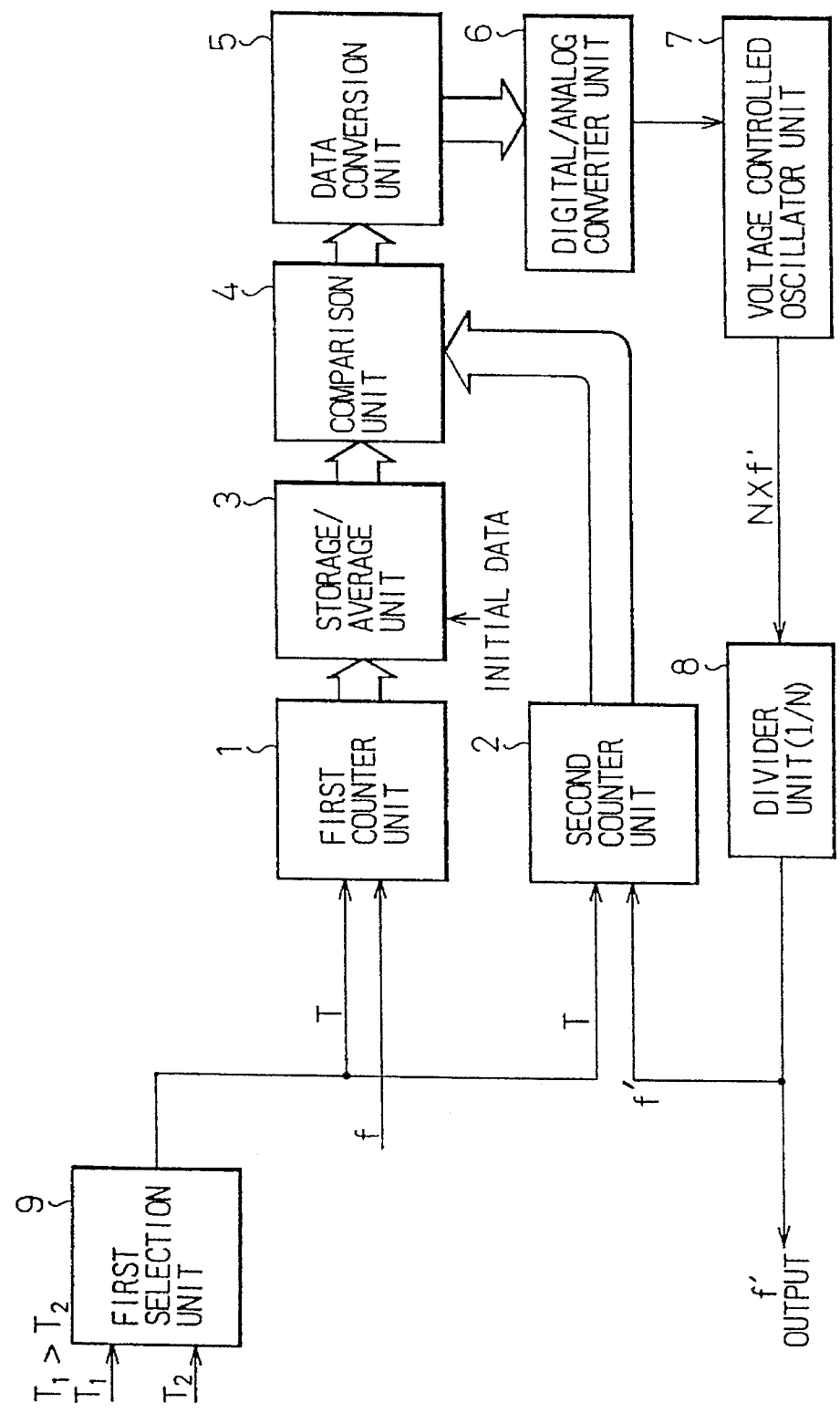
FIG. 1 is a block diagram showing a first embodiment of a frequency synchronous circuit according to the present invention.

FIG. 1 shows a first embodiment of a frequency synchronous circuit of the present invention. In FIG. 1, reference numeral 1 denotes a first counter unit (first frequency counter), 2 denotes a second counter unit (second frequency counter), 3 denotes a storage/average unit, and 4 denotes a comparison unit. Further, reference numeral 5 denotes a data conversion unit, 6 denotes a digital/analog converter unit, 7 denotes a voltage controlled oscillator unit, 8 denotes a divider unit, and 9 denotes a first selection unit.

As shown in FIG. 1, the first embodiment of the frequency synchronous circuit of the present invention comprises the first selection unit 9, first counter unit 1, second counter unit 2, storage/average unit 3, and comparison unit 4.

The first selection unit 9 is used to select one sampling signal between a first sampling signal $T_1$ and a second sampling signal $T_2$. The first sampling signal $T_1$ has a first sampling time, and the second sampling signal $T_2$ has a second sampling time shorter than the first sampling time. Concretely, for example, the first sampling time ($T_1$) of the first sampling signal $T_1$ is determined to be 10 sec., and the second sampling time ($T_2$) of the second sampling signal $T_2$ is determined to be 1 sec.

The first counter unit 1 is used to count a reference signal f supplied from outside the frequency synchronous circuit during a sampling time (T) which is defined by the one sampling signal (selected sampling signal) T selected by the first selection unit 9. The second counter unit 2 is used to count a synchronous clock signal f' to be output from the frequency synchronous circuit during the sampling time (T) of the selected sampling signal T.

The storage/average unit 3, which is connected to the first counter unit 1, is used to store and average an output signal from the first counter unit 1. The comparison unit 4, which is connected to the storage/average unit 3 and second counter unit 2, is used to compare an output signal from the storage/average unit 3 with an output signal of the second counter unit 2. Note that the frequency synchronous circuit outputs the synchronous clock signal f' whose frequency is synchronized in accordance with an output signal of the comparison unit 4. Further, the output signal of the first counter unit 1 is determined in accordance with a frequency of the reference signal f, and the output signal of the second counter unit 2 is determined in accordance with the frequency of the synchronous clock signal f'.

Further, as shown in FIG. 1, the frequency synchronous circuit of the first embodiment of the present invention further comprises the data conversion unit 5, digital/analog converter unit 6, voltage controlled oscillator unit 7, and divider unit 8.

The data conversion unit 5, which is connected to the comparison unit 4, is used to convert the output signal of the comparison unit 4 to digital data indicating a voltage level corresponding to the output signal of the comparison unit 4, and the digital/analog converter unit 6, which is connected to the data conversion unit 5, is used to convert the digital data output from the data conversion unit 5 into an analog voltage.

The voltage controlled oscillator unit 7, which is connected to the digital/analog converter unit 6, is used to generate a signal (N×f') having a frequency corresponding to the analog voltage output from the D/A converter unit 6, and the divider unit 8, which is connected to the voltage controlled oscillator unit 7 and second counter unit 2, is used to divide the output signal of the voltage controlled oscillator unit 7 and for outputting the synchronous clock signal f'.

In the frequency synchronous circuit of the first embodiment of the present invention, the reference signal f is counted during the sampling time of the selected sampling signal T ($T_1$ or $T_2$) by the first counter unit 1, and further, the synchronous clock signal f' is counted during the sampling time of the selected sampling signal T by the second counter unit 2. Further, the output signal of the first counter unit 1 is stored and averaged by the storage/average unit 3, and the output signal of the storage/average unit 3 is supplied to the comparison unit 4 to be compared with the output signal of the second counter unit 2. Therefore, the synchronous clock signal f' is synchronized with the frequency corresponding to the output signal of the comparison unit 4.

Namely, the reference signal (clock signal) f including noise is counted during the sampling time of the selected sampling signal T by the first counter unit 1 and averaged (stored and averaged) by the storage/average unit 3. The average data output from the storage/average unit 3 is compared with the counted value of the synchronous clock signal f' during the sampling time of the selected sampling signal by the second counter unit 2. Consequently, the synchronous clock signal f' (the original clock signal) can be picked up without including noise (noise components).

In the first embodiment of the present invention, the first selection unit 9 selects the second sampling signal $T_2$ (for example, 1 sec.) at the time of turning ON a power (power ON state) of the frequency synchronous circuit, and the first selection unit 9 selects the first sampling signal $T_1$ (for example, 10 sec.) during a stable state of the frequency synchronous circuit. Therefore, according to the first embodiment of the present invention, a transition period determined from a power ON state to a stable state can be decreased. Note that, in the power ON state (using the second sampling signal $T_2$), the effect of decreasing fluctuation caused by jitter and wander may be decreased, but there is no problem in general. On the other hand, in the stable state, the effect of decreasing the fluctuation is sufficient. Further, according to the first embodiment of the present invention, an unusual clock signal is not output from the frequency synchronous circuit, even though data is not sufficiently stored in a memory unit (storage/memory unit 3).

Further, as shown in FIG. 1, initial data may be supplied to the storage/average unit 3, and this initial data may be used to determine the synchronous clock signal f', when a power of the frequency synchronous circuit is turned ON. In this case, noise components which are included in the reference signal f may not be sufficiently removed and the synchronous clock signal f' may not be exactly synchronized with the reference signal f, but the synchronous clock signal f' can be immediately output in accordance with the initial data, when the power of the frequency synchronous circuit is turned ON. Note that an initial reference signal $f_0$ is preferably determined to be a center frequency ($f_0$) of the actual reference signal f, so that a difference between the initial reference signal $f_0$ and the average value (which is output of the storage/average unit 3) obtained by using the actual reference signal f can be reduced.

Figure 2:
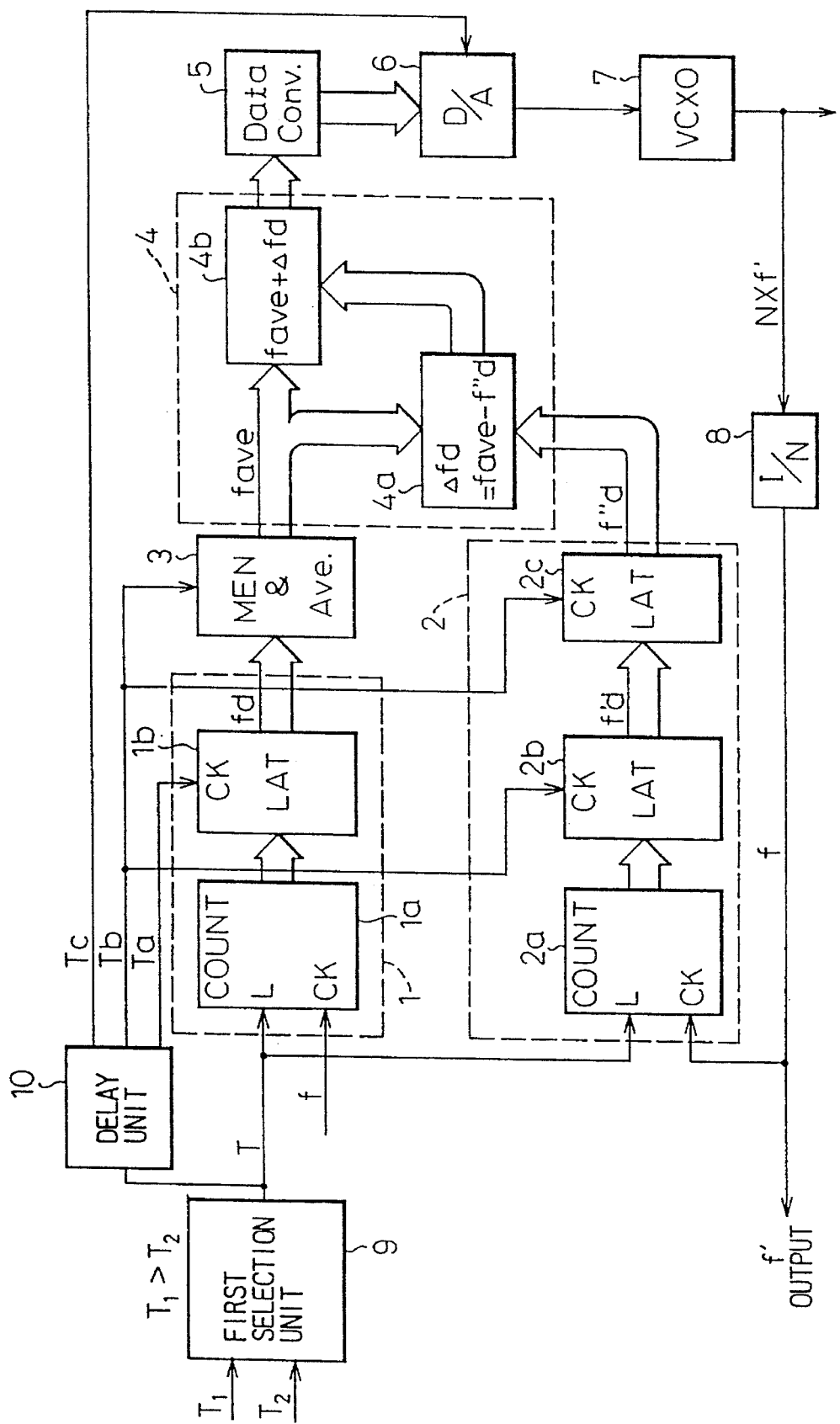
FIG. 2 is a block diagram concretely showing the first embodiment of FIG. 1.

FIG. 2 concretely shows the first embodiment of FIG. 1, and FIG. 3 is a timing chart for explaining the operation of the frequency synchronous circuit shown in FIG. 2.

In FIG. 2, reference numeral 1 denotes a counter unit (first frequency counter) for counting the frequency of a reference signal f, 2 denotes a counter unit (second frequency counter) for counting the frequency of an output signal (synchronous clock signal) f' of a divider 8, and 3 denotes a storage/average unit 3 for storing the value counted by the first frequency counter 1 during a specific period and for averaging the counted value. Further, in FIG. 2, reference numeral 4 denotes a frequency comparison unit (comparison unit) for comparing the averaged frequency of the storage/average unit 3 with the output frequency of the second frequency counter 2, 5 denotes a data conversion unit for converting the compared results of the frequency comparison unit 4 into voltage data, 6 denotes a D/A (digital/analog) converter for converting the voltage data output from the data conversion unit 5 into an analog voltage, 7 denotes a VCXO (Voltage-Controlled X-tal Oscillator), and 8 denotes the divider which is described above. In addition, in FIG. 2, reference numeral 9 denotes a first selection unit, and 10 denotes a delay unit.

As described with reference to FIG. 1, the first selection unit 9 is used to select one sampling signal between a first sampling signal $T_1$ and a second sampling signal $T_2$. Namely, the first selection unit 9 selects the second sampling signal $T_2$ (for example, 1 sec.) at the time of turning ON power (power ON state) to the frequency synchronous circuit, and the first selection unit 9 selects the first sampling signal $T_1$ (for example, 10 sec.) during a stable state of the frequency synchronous circuit.

The first frequency counter 1 comprises a counter circuit 1a and a latch circuit 1b, and the second frequency counter 2 comprises a counter circuit 2a and latch circuits 2b and 2c. The counter circuit 1a counts the reference signal f, which is supplied to a clock terminal CK of the counter circuit 1a from outside the frequency synchronous circuit, during a sampling time (T) of the selected sampling signal T.

Similarly, the counter circuit 2a counts the output signal (synchronous clock signal) f' of the divider 8, which is supplied to a clock terminal CK of the counter circuit 2a, during a sampling time (T) of a sampling signal T. Note that the synchronous clock signal f' is output from the frequency synchronous circuit.

An output signal of the counter circuit 1a is supplied to the storage/average unit 3 through the latch circuit 1b which is controlled by a control signal Ta. Further, an output signal of the counter circuit 2a is supplied to the storage/average unit 3 through the latch circuits 2b and 2c. Note that the latch circuit 2b is controlled by the control signal Ta and the latch circuit 2c is controlled by a control signal Tb. Further, the control signal Tb is supplied to the storage/average unit 3. The latch circuit 2b is used only to synchronize the timing of the output signal (f''d) of the second frequency counter 2 with the output signal (fave) of the storage/average unit 3 at the frequency comparison unit 4.

The storage/average unit 3 comprises M stages of memory, and calculates an average value of the M stages. Namely, the storage/average unit 3 calculates an average frequency during M×T seconds. Therefore, frequency components (noise components of jitter and wander) higher than 1/(M×T) Hz can be removed.

The frequency comparison unit 4 compares the data (averaged data) output from the storage/average unit 3 with the data output from the second frequency counter 2, and the result is supplied to the data conversion unit 5. Namely, the frequency comparison unit 4 comprises a difference detection portion 4a and a compensation portion 4b. The difference detection portion 4a is used to obtain a difference (Δfd) by subtracting data (f''d) output from the second frequency counter 2 from an averaged data (fave) output from the storage/average unit 3, and the compensation portion 4b is used to compensate (fave+Δfd) the data to be output to the data conversion unit 5 based on the detected results of the difference detection portion 4a. Namely, the output data of the frequency comparison unit 4 is determined by adding the difference Δfd (which is obtained by the difference detection portion 4a) to the averaged data fave (output from the storage/average unit 3).

The data conversion unit 5 is used to convert the output data of the frequency comparison unit 4 into voltage data by using a table such a ROM or the like. Further, D/A converter 6 is used to convert the voltage data (digital data) output from the data conversion unit 5 into an analog voltage. Note that the D/A converter 6 is supplied with the control signal Tc. The control signals Ta, Tb and Tc are output from the delay unit 10 by delaying the selected sampling signal T. Namely, as shown in FIG. 3, the selected sampling signal T ($T_1$ or $T_2$) and control signals Ta, Tb, Tc have the same time period (for example, 1 sec. or 10 sec.), but the phases thereof are different from each other.

As shown in FIG. 3, the output data (output signal) fd of the latch circuit 1b and the output data f'd of the latch circuit 2b are changed in accordance with the control signal Ta, and the output data fave of the storage/average unit 3 and the output data f''d of the latch circuit 2c are changed in accordance with the control signal Ta.

The analog voltage output from the D/A converter 6 is used as a control voltage for the VCXO 7, and the VCXO 7 generates a signal having a frequency (N×f') corresponding to the analog voltage. Further, the divider 8 is used to divide the frequency (N×f') generated by the VCXO 7 into 1/N, and thus, the frequency of the output signal of the divider 8 is determined to be f'. Note that the divided output signal (synchronous clock signal) f' of the divider 8 is supplied to the second frequency counter 2.

In the above descriptions, in accordance with making larger the number of the memory stages M of the storage/average unit 3 and making larger the value of the sampling signal T ($T_1$ or $T_2$), lower frequency noise can be removed, but the transition period determined from a power ON state to a stable state becomes long. In the first embodiment of the present invention, the first selection unit 9 selects the second sampling signal $T_2$ having the shorter sampling time (for example, 1 sec.) at the power ON state, and the first selection unit 9 selects the first sampling signal $T_1$ having the longer sampling time (for example, 10 sec.) during the stable state. Therefore, according to the first embodiment of the present invention, a transition period determined from a power ON state to a stable state can be decreased, and further, an unusual clock signal is not output from the frequency synchronous circuit, even though data is not sufficiently stored in the storage/memory unit 3.

Further, according to the first embodiment of the present invention, the pull-in range of the frequency synchronous circuit can be expanded to cover any frequency produced by the VCXO 7, since the pull-in range depends on the characteristics of the data conversion unit 5 regardless the value (period) of the sampling signal T ($T_1$ or $T_2$) and the number of the memory stages M of the storage/average unit 3.

Figure 4:
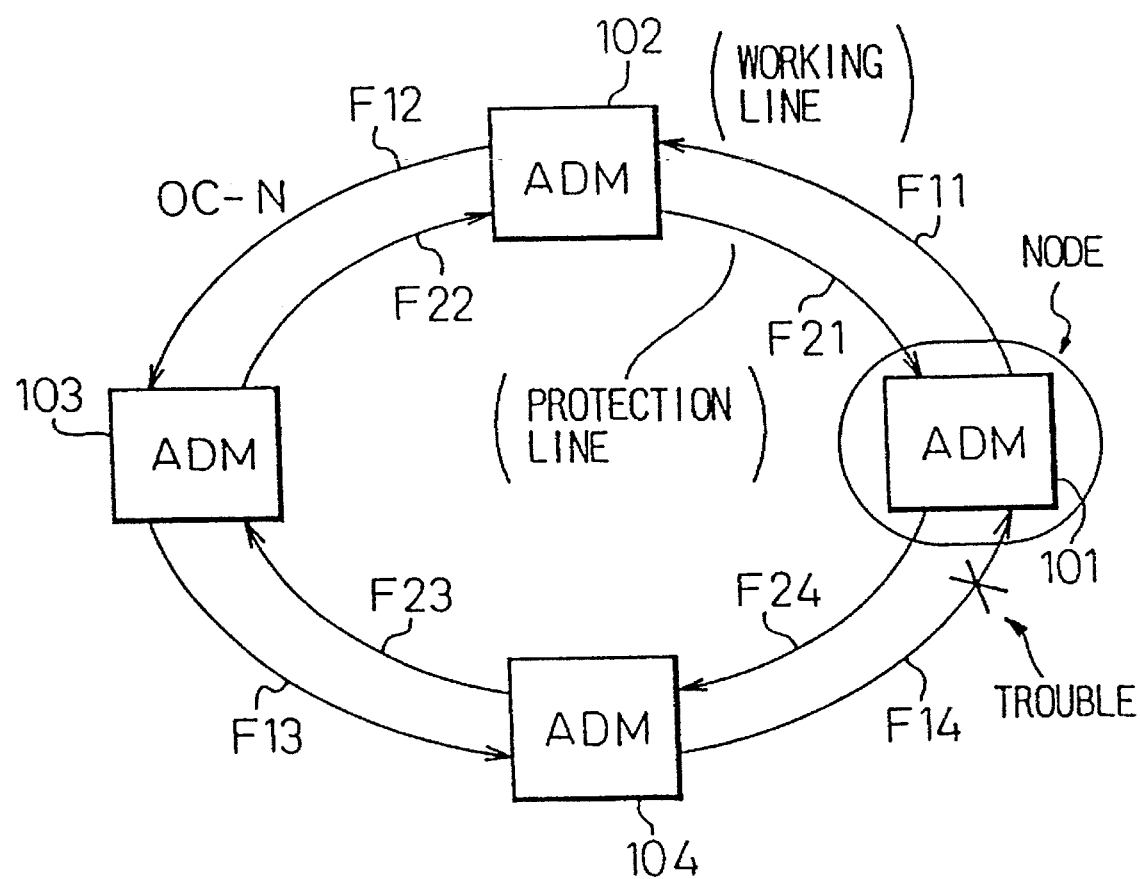
FIG. 4 is a diagram schematically showing an example of a path protection switch ring system of a synchronous optical network (SONET) which uses a frequency synchronous circuit of the present invention.

FIG. 4 shows an example of a path protection switch ring system of a synchronous optical network (SONET) which uses a frequency synchronous circuit of the present invention. In FIG. 4, reference numerals 101, 102, 103, and 104 denote ADMs (Adaptive Delta Modulators) corresponding to nodes, F11, F12, F13, and F14 denote working optical fibers, and F21, F22, F23, and F24 denote protection optical fibers.

As shown in FIG. 4, for example, the path protection switch ring system of the SONET comprises an anticlockwise working line (working transmission line) and a clockwise protection line (protection transmission line). The working line is constituted by connecting the ADMs 101, 102, 103, 104 and the optical fibers F11, F12, F13, F14, and the protection line is constituted by connecting the ADMs 101, 102, 103, 104 and the optical fibers F21, F22, F23, F24. Note that in the path protection switch ring system, an anticlockwise working line is generally used.

Figure 5:
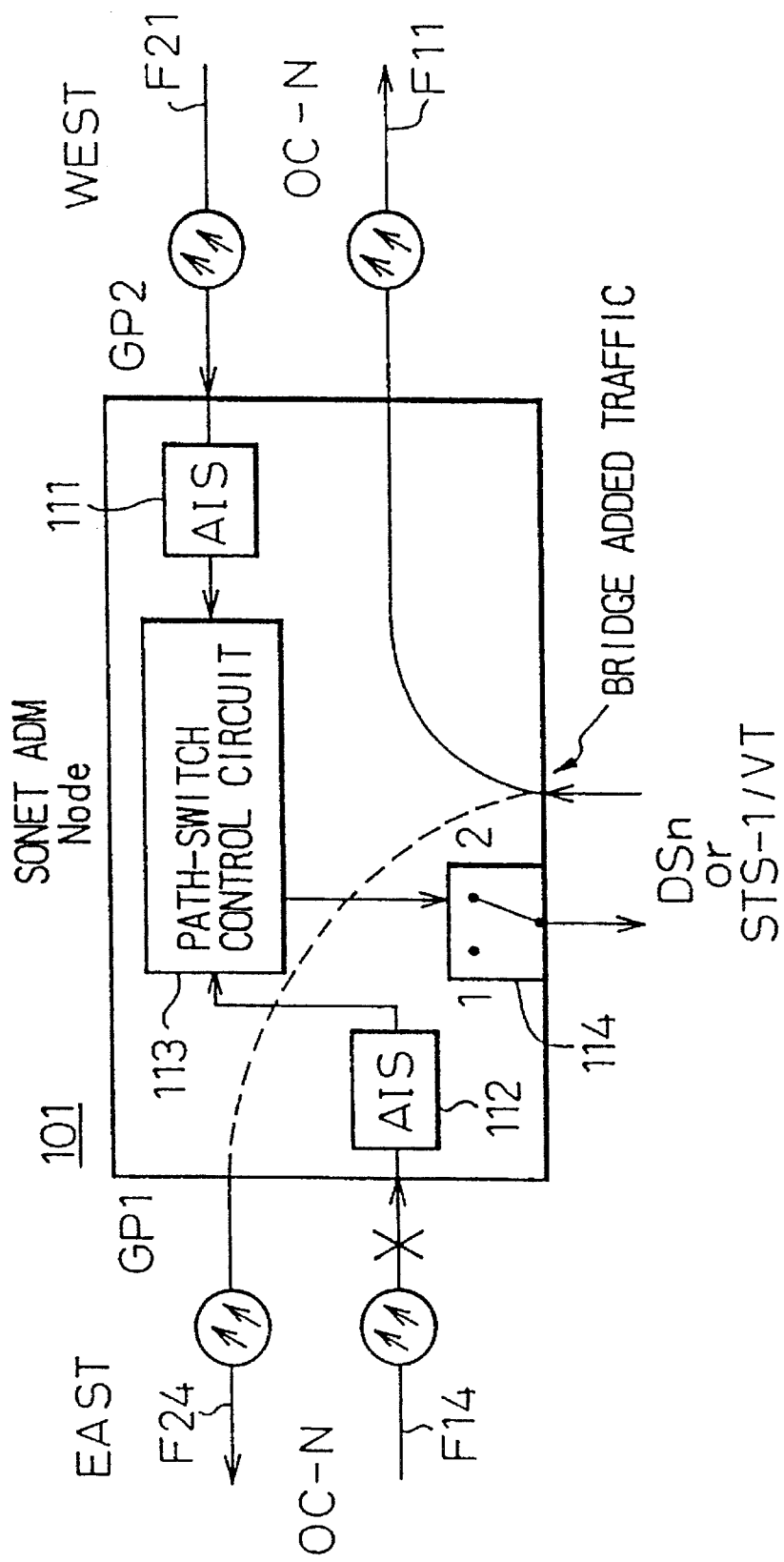
FIG. 5 is a diagram schematically showing a configuration of an adaptive delta modulation (ADM) in order to explain an operation of the path protection switch ring system shown in FIG. 4.

FIG. 5 schematically shows a configuration of an ADM 101 in order to explain an operation of the path protection switch ring system shown in FIG. 4. In FIG. 5, reference numerals 111 and 112 denote AIS (Alarm Indication Signal) detection circuits, 113 denotes a path-switch control circuit, and 114 denotes a path-switch.

As shown in FIGS. 4 and 5, in a general service condition, the anticlockwise working line having the optical fibers F11, F12, F13, F14 is used., For example, when a trouble or accident (for example, cutting of the optical fiber F14) is caused in the optical fiber F14 used for the working line, an AIS (Alarm Indication Signal, which is a signal where all bits are "1") is output, and the AIS is detected by the AIS detection circuit 112. Further, an output of the AIS detection circuit 112 is supplied to the path-switch 113, so that the trouble of the working line is confirmed and a selection signal is output to the path-switch 114. Note that this switching operation is carried out in each of the ADMs 101 to 104, and then the protection line of clockwise rotation having the optical fibers F21, F22, F23, F24 is automatically selected and used. Consequently, in the path protection switch ring system, when the working line cannot be used, the protection line is automatically selected and used, so that service can be continued.

The frequency synchronous circuit of the present invention can be applied to the above described path protection switch ring system.

Figure 6:
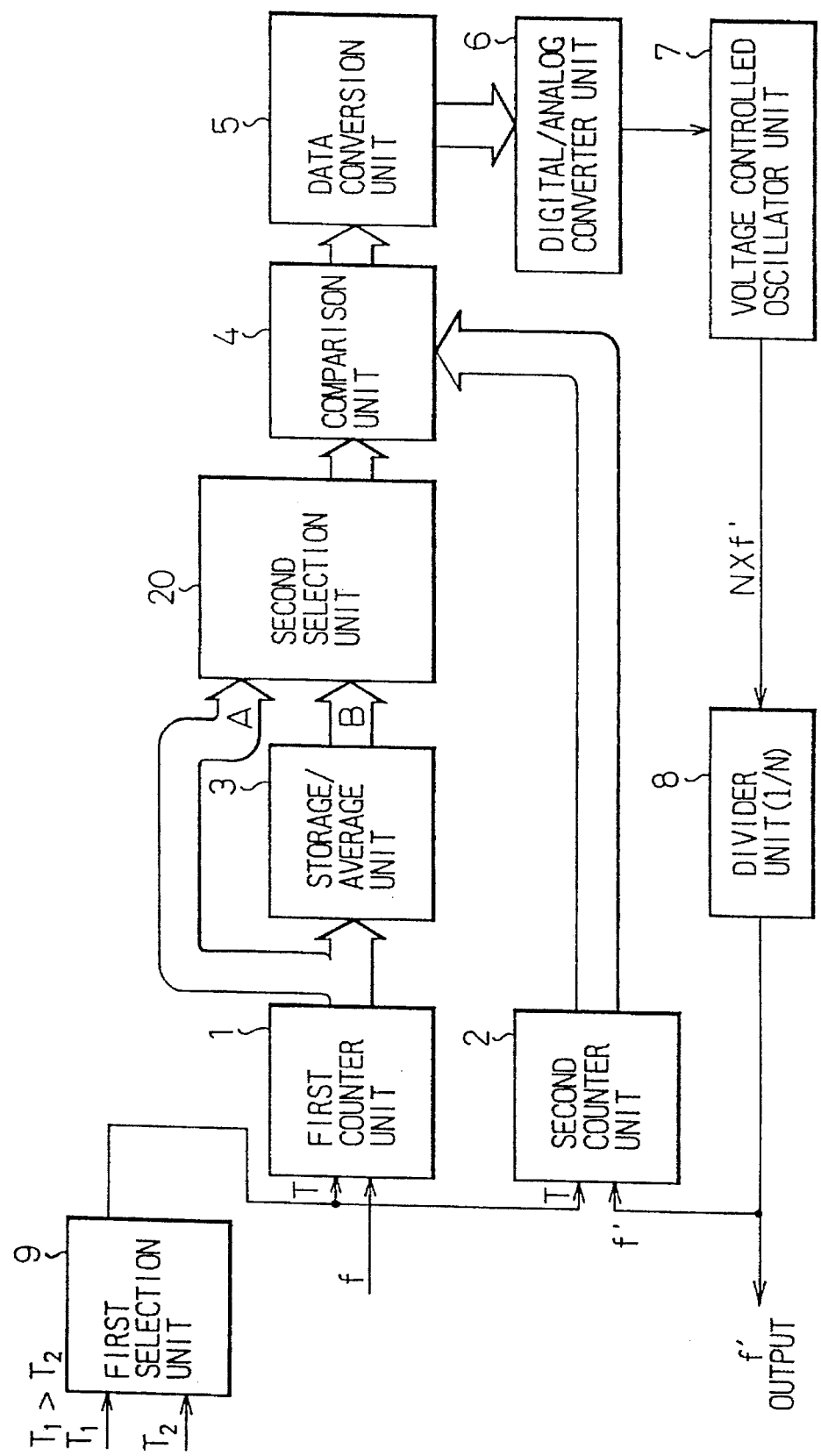
FIG. 6 is a block diagram showing a second embodiment of a frequency synchronous circuit of the present invention.

FIG. 6 shows a second embodiment of a frequency synchronous circuit of the present invention. In FIG. 6, a reference numeral 20 denotes a second selection unit. Namely, this second embodiment of the present invention further comprises the second selection unit in addition to the first embodiment. Therefore, the other configurations of the second embodiment are the same as that of the first embodiment, and thus the explanations thereof are omitted.

As shown in FIG. 6, in the second embodiment of the present invention, the second selection unit 20 is provided between the storage/average unit 3 and the comparison unit 4, and the output signal of the first counter unit 1 is directly supplied to the second selection unit 20. Namely, the second selection unit 20 receives the output signal (A) of the first counter unit 1 and the output signal (B) of the storage/average unit 3. Note that the second selection unit 20 selects the output signal (A) of the first counter unit 1 at the time (power ON state) of turning ON power to the frequency synchronous circuit, and the second selection unit 20 selects the output signal (B) of the storage/average unit 3 during a stable state of the frequency synchronous circuit.

In the above second embodiment, when power to the frequency synchronous circuit is turned ON, the second selection unit 20 selects the output signal (A) of the first counter unit 1. Therefore, the comparison unit 4 immediately compares the output signal (A) with the output signal of the second counter unit 2, and thereby the synchronous clock signal f' can be output in a short time. In this case, noise components included in the reference signal f are not removed and the synchronous clock signal f' may not be exactly synchronized with the reference signal f, but the synchronous clock signal f' can be immediately output, when the power of the frequency synchronous circuit is turned ON. On the other hand, in the stable state, noise components (jitter and wander) included in the reference signal f can be sufficiently removed by using the output signal (output data) of the storage/average unit 3.

FIG. 7 shows a third embodiment of a frequency synchronous circuit of the present invention. In FIG. 7, reference numeral 11 denotes a first subtraction unit (first subtraction processing unit), and 12 denotes a second subtraction unit (second subtraction processing unit). Namely, in the frequency synchronous circuit of FIG. 7, the first subtraction unit 11 is inserted between the first frequency counter 1 and the storage/average unit 3, and the second subtraction unit 12 is inserted between the second frequency counter 2 and the frequency comparison unit 4. Note that the first subtraction unit 11 is used to subtract a specific value ($f_0$) from the output (f) of the first counter unit 1 ($\Delta f = f - f_0$), and the second subtraction unit 12 is used to subtract the above described specific value ($f_0$) from the output of the second counter unit 2 ($\Delta f' = f' - f_0$). Further, the specific value $f_0$ can be determined to be a center frequency of the reference signal f.

The output ($\Delta f$) of the first subtraction unit 11 is supplied to the frequency comparison unit 4 through the storage/average unit 3, and then the output ($\Delta f$) of the first subtraction unit 11 is compared with the output ($\Delta f'$) of the second subtraction unit 12 in the frequency comparison unit 4.

Namely, in the frequency comparison unit 4, the difference between the frequency of the actual reference signal f and the center frequency $f_0$ of the reference signal is compared with the difference between the frequency of the synchronous clock signal (output of the divider 8) f' and the center frequency $f_0$ of the reference signal. The other configurations are the same as that of the first embodiment of the present invention.

Therefore, when the center frequency ($f_0$) of the reference signal coincides with the frequency of the actual reference signal (f), the data of the storage/average unit (memory) 3 is determined to be "0". Consequently, the frequency discrepancy at the time of power ON can be decreased by setting the data of the storage/average unit 3 to be all "0" as an intial value. Further, the number of bits to be processed in the storage/average unit 3 and the frequency comparison unit 4 can be decreased, and thus the circuit magnitude can be decreased.

As described above, according to a frequency synchronous circuit of the present invention, a transition period from a power ON state to a stable state can be decreased, and further, an unusual clock signal is not output from the frequency synchronous circuit, even though data is not sufficiently stored in a memory unit. Further, according to a frequency synchronous circuit of the present invention, an original clock signal can be obtained and output by removing noise components from a clock signal having the noise components which are caused by various factors. In addition, according to the frequency synchronous circuit of the present invention, the phase fluctuation caused by the change of reference signals can be decreased, and a specific timing can be continuously maintained when a trouble is caused in the reference signal.

Many different embodiments of the present invention may be constructed without departing from the spirit and scope of the present invention, and it should be understood that the present invention is not limited to the specific embodiments described in this specification, except as defined in the appended claims.

I claim:

1. A frequency synchronous circuit comprising:
    a first selection means for selecting one sampling signal between a first sampling signal having a first sampling time and a second sampling signal having a second sampling time shorter than the first sampling time;
    a first counter means, connected to said first selection means, for counting a reference signal supplied from outside said frequency synchronous circuit during the sampling time of said selected sampling signal;
    a second counter means, connected to said first selection means, for counting a synchronous clock signal to be output from said frequency synchronous circuit during the sampling time of said selected sampling signal;
    a storage and average means, connected to said first counter means, for storing and averaging an output signal of said first counter means; and
    a comparison means, connected to said storage and average means and said second counter means, for comparing an output signal of said storage and average means with an output signal of said second counter means, wherein said frequency synchronous circuit outputs the synchronous clock signal whose frequency is synchronized in accordance with an output signal of said comparison means.

2. A frequency synchronous circuit as claimed in claim 1, wherein said first selection means selects the second sampling signal at a time of turning ON power to said frequency synchronous circuit, and said first selection means selects the first sampling signal during a stable state of said frequency synchronous circuit.

3. A frequency synchronous circuit as claimed in claim 1, wherein said storage and average means includes initial data, and when power to said frequency synchronous circuit is turned ON, the synchronous clock signal is determined in accordance with the initial data of said storage and average means.

4. A frequency synchronous circuit as claimed in claim 1, wherein said frequency synchronous circuit further comprises a second selection means, connected to said first counter means, said storage and average means and said comparison means, for selecting one output signal between said first counter means and said storage and average means.

5. A frequency synchronous circuit as claimed in claim 4, wherein said second selection means selects an output signal of said first counter means at a time of turning ON power to said frequency synchronous circuit, and said second selection means selects an output signal of said storage and average means during a stable state of said frequency synchronous circuit.

6. A frequency synchronous circuit as claimed in claim 1, wherein the output signal of said first counter means is determined in accordance with a frequency of the reference signal, and the output signal of said second counter means is determined in accordance with the frequency of the synchronous clock signal.

7. A frequency synchronous circuit as claimed in claim 1, wherein said frequency synchronous circuit further comprises:
    a data conversion means, connected to said comparison means, for converting the output signal of said comparison means to digital data indicating a voltage level corresponding to the output signal of said comparison means;
    a digital/analog converter means, connected to said data conversion means, for converting the digital data output from said data conversion means into an analog voltage;
    a voltage controlled oscillator means, connected to said digital/analog converter means, for generating a signal having a frequency corresponding to the analog voltage output from said D/A converter means; and
    a divider means, connected to said voltage controlled oscillator means and said second counter means, for dividing the output signal of said voltage controlled oscillator means and for outputting the synchronous clock signal.

8. A frequency synchronous circuit as claimed in claim 1, wherein said frequency synchronous circuit further comprises:
    a first subtraction means, connected to said first counter means and said storage and average means, for subtracting a specific value from the output signal of said first counter means and for supplying the subtracted result to said storage and average means; and
    a second subtraction means, connected to said second counter means and said storage and average means, for subtracting the specific value from the output signal of said second counter means and for supplying the subtracted result to said comparison means.

9. A frequency synchronous circuit as claimed in claim 8, wherein the specific value is determined to be a center frequency of the reference signal.

10. A frequency synchronous circuit as claimed in claim 1, wherein said frequency synchronous circuit is applied to a path protection switch ring system of one of a synchronous optical network and a synchronous digital hierarchy.

* * * * *